United States Patent
D'Souza et al.

(10) Patent No.: US 10,312,868 B2
(45) Date of Patent: Jun. 4, 2019

(54) CORRECTING FOR NON-LINEARITY IN AN AMPLIFIER PROVIDING A DIFFERENTIAL OUTPUT

(71) Applicant: Aura Semiconductor Pvt. Ltd, Bangalore (IN)

(72) Inventors: Arnold J D'Souza, Bangalore (IN); Shyam Somayajula, Bangalore (IN)

(73) Assignee: AURA SEMICONDUCTOR PVT. LTD, Bangalore (IN)

( * ) Notice: Subject to any disclaimer, the term of this patent is extended or adjusted under 35 U.S.C. 154(b) by 0 days.

(21) Appl. No.: 15/957,927

(22) Filed: Apr. 20, 2018

(65) Prior Publication Data

US 2018/0309413 A1 Oct. 25, 2018

(30) Foreign Application Priority Data

Apr. 20, 2017 (IN) .............................. 201741014020

(51) Int. Cl.
*H03F 3/45* (2006.01)
*H03F 1/32* (2006.01)
(Continued)

(52) U.S. Cl.
CPC ................. *H03F 1/32* (2013.01); *H03F 1/02* (2013.01); *H03F 1/0227* (2013.01);
(Continued)

(58) Field of Classification Search
CPC ....................................................... H03F 3/45
(Continued)

(56) References Cited

U.S. PATENT DOCUMENTS 5,557,234 A 9/1996 Collins
5,614,864 A * 3/1997 Stubbe ................ H03F 3/45475
330/258

(Continued)

OTHER PUBLICATIONS

Jim Brown and Bill Whitlock, Common-Mode to Differential-Mode Conversion in Shielded Twisted-Pair Cables (Shield-Current-Induced Noise), Aes 114th Convention, Amsterdam, The Netherlands, http://audiosystemsgroup.com/AES-SCIN-ASGWeb.pdf, date Mar. 1, 2003, pp. 1-22.

(Continued)

*Primary Examiner* — Henry Choe
(74) *Attorney, Agent, or Firm* — Iphorizons PLLC; Narendra Reddy Thappeta

(57) ABSTRACT

A fully differential amplifier includes a first feedback resistance, a second feedback resistance, a first input resistance and a second input resistance. A first ratio of the first feedback resistance to the first input resistance is equalized with that of a reference ratio of a pair of reference resistances. Similarly a second ratio of the second feedback resistance to the second input resistance is also equalized with that of the reference ratio. Such equalization operations may be performed during a calibration phase prior to normal operation of the fully differential amplifier. Accordingly, when a common mode voltage present on each of the first output terminal and the second output terminal varies during normal operation, contribution of an erroneous differential signal component across the pair of differential output terminals is prevented.

20 Claims, 7 Drawing Sheets

(51) Int. Cl.
*H03F 3/21* (2006.01)
*H03F 1/02* (2006.01)
*H03M 1/38* (2006.01)

(52) U.S. Cl.
CPC ............ *H03F 1/3211* (2013.01); *H03F 3/21* (2013.01); *H03F 3/45475* (2013.01); *H03F 3/45937* (2013.01); *H03F 2200/129* (2013.01); *H03F 2200/331* (2013.01); *H03F 2201/3215* (2013.01); *H03F 2203/45522* (2013.01); *H03F 2203/45528* (2013.01); *H03F 2203/45594* (2013.01); *H03M 1/38* (2013.01)

(58) Field of Classification Search
USPC .......................................... 330/69, 252, 260
See application file for complete search history.

(56) References Cited

U.S. PATENT DOCUMENTS

| | | | |
|---|---|---|---|
| 5,877,612 A * | 3/1999 | Straw ................... | H03G 1/0088 330/254 |
| 6,362,684 B1 | 3/2002 | Klein et al. | |
| 7,327,190 B2 | 2/2008 | D'Abramo et al. | |
| 7,349,465 B2 * | 3/2008 | Mangino ................ | H04B 1/581 375/220 |
| 8,604,955 B2 * | 12/2013 | Oishi ..................... | H04L 27/04 341/118 |
| 2006/0255997 A1 | 11/2006 | Li et al. | |
| 2012/0086510 A1 | 4/2012 | Kumar et al. | |

OTHER PUBLICATIONS

Mike Dudek, Piers Dawe, Common Mode and Common Mode to Differential conversion specifications in P802.3bj Draft 2.0, http://www.ieee802.org/3/bj/public/may13/dudek_3bj_01_0513.pdf, date May 13, 2013, pp. 1-17.
John Miller, DC Output Errors in a Fully-Differential Amplifier, http://www.ti.com/lit/an/slva417/slva417.pdf, date May 25, 2010, pp. 1-11.
AN-1447 Improving PSRR and CMRR in Fully Differential Amplifiers, http://www.ti.com/lit/an/snoa467a/snoa467a.pdf, date Jul. 24, 2006, pp. 1-8.
Tyler Hutchison, Matched Resistor Networks for Precision Amplifier Applications, http://www.linear.com/solutions/5053, downloaded circa Feb. 15, 2017, pp. 1-4.
Matthias Spägele et al., Reduction of differential-mode to common-mode conversion by means of analytic description in common-mode chokes used for an automotive communication bus system, IET Science, Measurement & Technology, Feb. 27, 2014, pp. 74-80, vol. 8, Issue: 2, IET.

* cited by examiner

CORRECTING FOR NON-LINEARITY IN AN AMPLIFIER PROVIDING A DIFFERENTIAL OUTPUT

PRIORITY CLAIM

The instant patent application is related to and claims priority from the co-pending provisional India patent application entitled, "Improved Linearity of Speaker Driver", Serial No.: 201741014020, Filed: 20 Apr. 2017, which is incorporated in its entirety herewith to the extent not inconsistent with the description herein.

BACKGROUND

Technical Field

Embodiments of the present disclosure relate generally to amplifiers, and more specifically to correcting for non-linearity in an amplifier providing a differential output.

Related Art

An amplifier refers to a component which amplifies an input signal to generate an output signal. The magnitude of amplification is referred to as gain factor, which can be more than one, less than one, positive or negative, as is well known in the relevant arts. Amplifiers find use in a wide range of devices such as power amplifiers, low noise amplifiers, etc., as is also well known in the relevant arts.

An amplifier may be designed to provide an output in differential form. Such amplifiers have a pair of output nodes across which the output signal is provided. The input signal provided to such amplifiers is typically also in differential form, and such amplifiers are also referred to as fully differential amplifiers.

Non-linearity in an amplifier refers to deviations from a straight line in the transfer characteristics (Output-versus-Input relationship) of the amplifier. Non-linearity in an amplifier typically causes undesirable distortions in the output signal of the amplifier. For example, an audio power amplifier may have a power-amplifying stage that provides a differential output. Non-linearity in the power-amplifying stage may result in a pure sine wave input being amplified to a differential output signal that may contain harmonics of the fundamental frequency of the input, thereby distorting the output signal, which may not be desirable.

Aspects of the present disclosure are directed to correcting for non-linearity in an amplifier providing a differential output.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
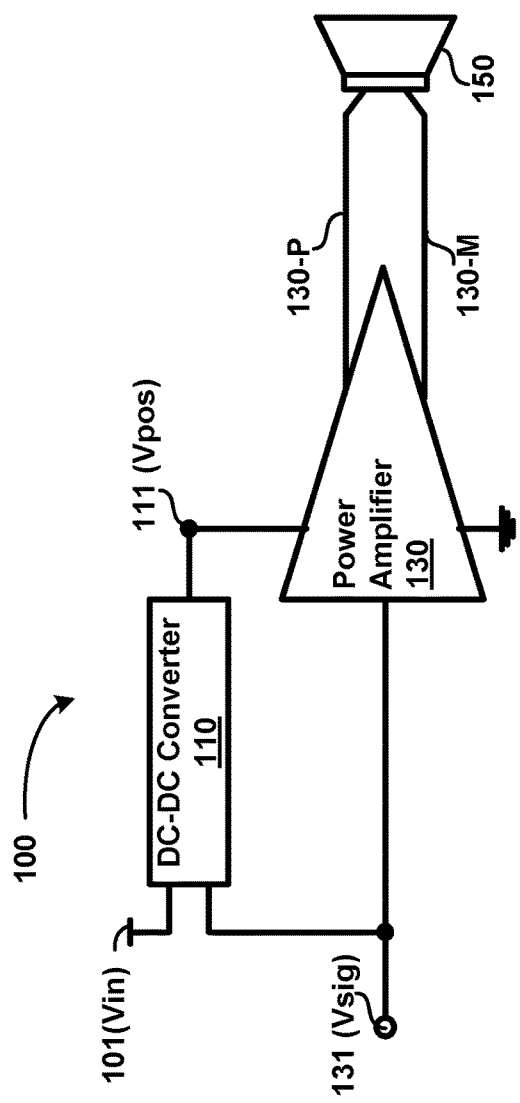
FIG. 1 is a block diagram of an example component in which several aspects of the present disclosure can be implemented.

Aspects of the present disclosure are described in the context of a fully differential amplifier having a gain block, which in turn contains a pair of differential input terminals and a pair of differential output terminals. A first feedback resistance is present between a first input terminal of the pair of differential inputs terminals and a first output terminal of the pair of differential output terminals. A second feedback resistance is present between a second input terminal of the pair of differential inputs terminals and a second output terminal of the pair of differential output terminals. A first input resistance is present between the first input terminal and a first signal input node, and a second input resistance is present between the second input terminal and a second signal input node.

According to an aspect of the present invention, a first ratio of the first feedback resistance to the first input resistance is equalized with that of a reference ratio of a pair of reference resistances. Similarly a second ratio of the second feedback resistance to the second input resistance is also equalized with that of the reference ratio.

Such equalization operations may be performed during a calibration phase prior to normal operation of the fully differential amplifier. Accordingly, when a common mode voltage present on each of the first output terminal and the second output terminal varies during normal operation, maintaining the first ratio equal to the second ratio prevents variations in the common mode voltage from contributing an erroneous differential signal component across the pair of differential output terminals.

In an embodiment, the pair of reference resistances contains a pair of resistors connected in series at a reference junction, wherein the first input resistance is implemented as a first input resistor. The first feedback resistance comprises a first resistor network in parallel with a first feedback resistor, wherein the first resistor network contains individual resistors together providing different effective resistances in different connection configurations. Thus equalizing of the first ratio may entail changing the connection configurations of the first resistor network until a first voltage at a first junction of the first feedback resistor and the first input resistor equals a second voltage at the reference junction.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Component

FIG. 1 is a block diagram of an example component in which several aspects of the present disclosure can be implemented. Component 100 (which may be implemented in integrated circuit form) is shown containing DC-DC converter 110, power amplifier 130 and speaker 150.

Power amplifier 130, which may be a class AB or push-pull power amplifier, receives a signal Vsig (131) (which may, for example, be an audio signal) and generates a corresponding power-amplified output across terminals 130-P and 130-M, which drives speaker 150. Power amplifier 130 receives regulated voltage 111 (Vpos) for operation from DC-DC converter 110.

DC-DC converter 110 receives signal Vsig, and power from power source 101 (Vin, which may be a battery). DC-DC converter 110 generates regulated voltage Vpos such that Vpos is (ideally) always slightly larger than the maximum of voltages 130-P and 130-M by a desired predetermined magnitude (termed headroom, as noted below). Thus, the power supply to power amplifier 130 is modulated based on the instantaneous voltage of the power-amplified output (or equivalently based on the input signal Vsig or an intermediate signal such as the output of a pre-amplifier providing voltage gain to Vsig). As a result, efficiency of power amplifier 130 is enhanced. In an embodiment, component 100 referred to as a class-L amplifier, is described in detail in U.S. Pat. No. 9,319,495, entitled 'Power Amplifier Providing High Efficiency', which is incorporated in its entirety herewith. Class-L modulation is further illustrated with respect to FIGS. 2A and 2B.

Figure 2A:
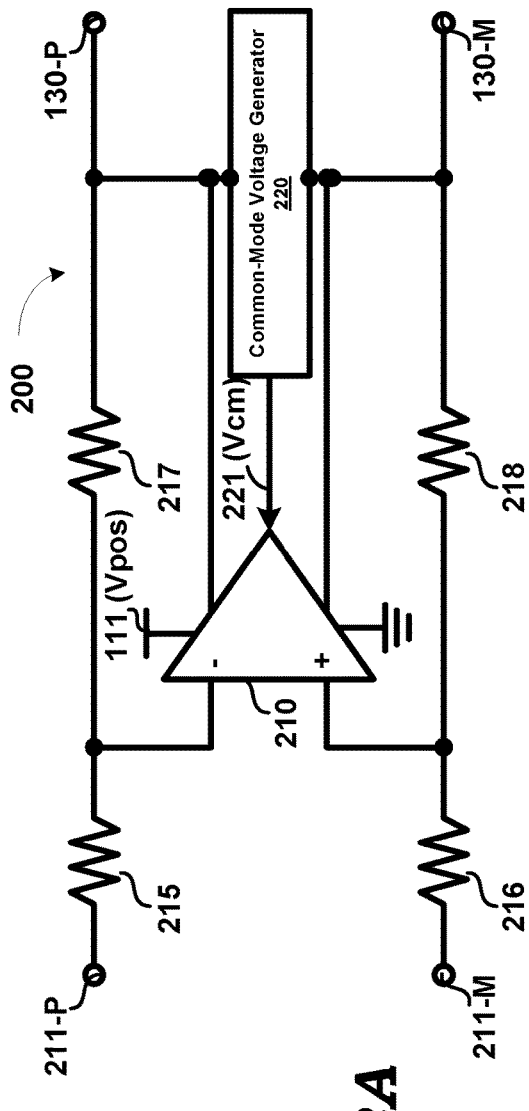
FIG. 2A is a block diagram illustrating the details of a power-amplification stage of a power amplifier, in an embodiment of the present disclosure.

FIG. 2A shows the power-amplification stage (amplifier 200) of power amplifier 130, in an embodiment of the present disclosure Amplifier 200 is shown containing gain block 210, input resistors 215 (P-side input resistor) and 216 (M-side input resistor), feedback resistors 217 (P-side feedback resistor) and 218 (M-side feedback resistor) and common-mode voltage generator 220. Gain block 210 contains a pair of input nodes marked +and -. The + terminal represents a non-inventing input node, while the - terminal represents an inventing input node. Amplifier 200 receives a differential input across terminals 211-P (first signal input terminal) and 211-M (second signal input terminal), and generates a corresponding amplified output signal across terminals 130-P and 130-M. The ratio of resistance of resistor 217 (or 218) to resistance of resistor 215 (or 216) equals the gain provided by amplifier 200. Input signal across terminals 211-P and 211-M may be generated by a pre-amplifier (not shown, but implemented in a known way) providing voltage gain to Vsig. Gain block 210 is powered by Vpos. Terminal marked GND represents a ground terminal.

Figure 2B:
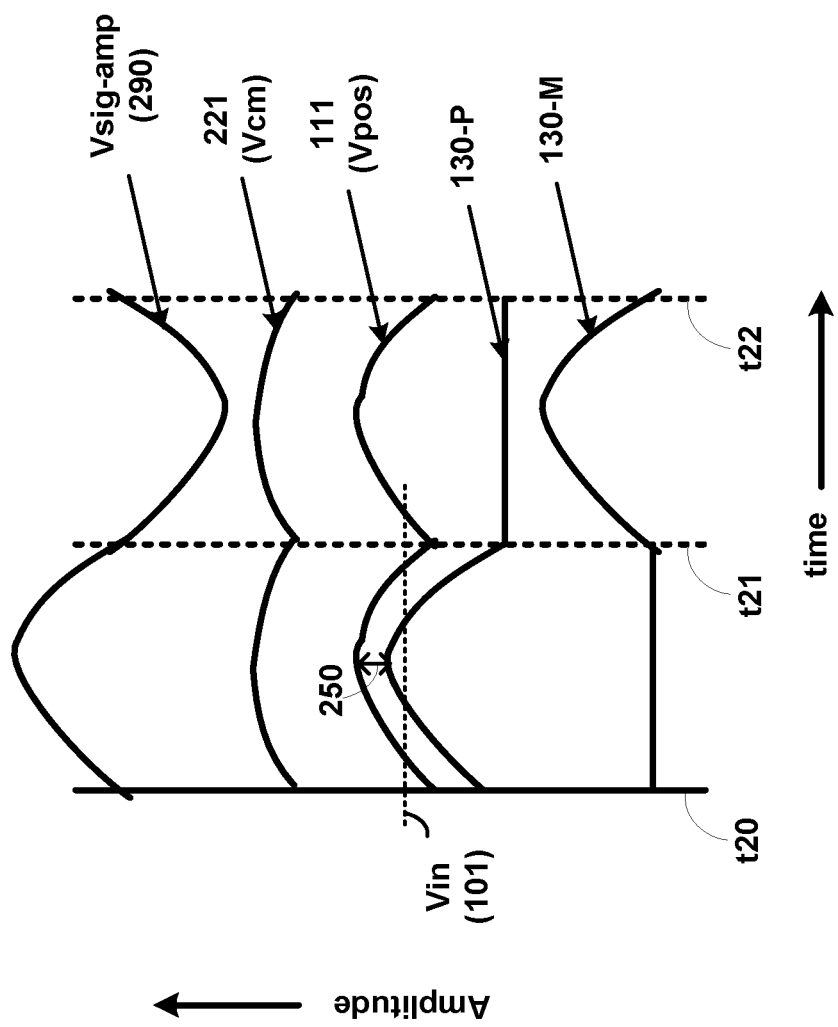
FIG. 2B depicts various waveforms illustrating the manner in which a regulated voltage provided to power a power-amplifier is generated, in an embodiment of the present disclosure.

FIG. 2B is an example diagram illustrating the manner in which Vpos (111) is modulated based on the instantaneous voltage of amplified output signal 130-P/130-M, in an embodiment of the present disclosure. Each of signals 130-P and 130-M is shown as a half sine wave which together differentially represent a sine wave 290 (Vsig-amp). Vsig-amp (290) is a power-amplified version of signal 211-P/211-M. Regulated output voltage Vpos is shown 'tracking' the higher of signals 130-P and 130-M. Although a single tone (pure sine wave) is shown in the illustration of FIG. 2B, in an embodiment, such tracking may be provided over the entire range of audio frequencies (20 Hz to 20 KHz) of signals 130-P/130-M. Marker 250 represents the instantaneous difference between Vpos 111 and the voltage of the greater of signals 130-P and 130-M (or equivalently the instantaneous absolute value (disregarding polarity or sign) of Vsig-amp 720). The instantaneous difference between Vpos and the larger of 130-P/130-M is termed 'headroom', and is indicated by marker 250.

For greater efficiency, the common-mode voltage 221 (Vcm, generated by common-mode voltage generator 220) at the output terminals 130-P and 130-M has the shape of a full-wave rectified waveform and has an instantaneous value equal to Vpos/2. As is well known, common-mode voltage refers to a voltage that is applied to both terminals of a differential terminal. Thus, common-mode voltage generator applies Vcm to both terminals 130-P/130-M. In general, the instantaneous magnitude of Vcm is dependent on (and varies with) the instantaneous magnitude of Vsig 131.

Ideally, the resistances of resistors 217 and 218 should be exactly equal. Similarly, the resistances of resistors 215 and 216 should be exactly equal. Any difference (mismatch) between the ratio of resistances of resistors 215 to 217 and resistances of resistors 216 to 218 causes common-mode to differential conversion. Thus, any mismatch in the above-noted ratios can cause output common mode 221 (Vcm) to be (partially) converted to a differential mode signal that appears across output 130-P/130-M. Such conversion from common-mode to differential mode causes non-linearity in the output-versus-input relationship (transfer characteristics) of amplifier 200. Hence, a pure sine wave input across input terminals 211-P/211-M can result in output signal across output terminals 130-P/130-M having harmonic components in addition to the fundamental frequency of the pure sine wave, thereby causing distortion in the output signal, which is undesirable. Equivalently, for zero differential input across 211-P/211-M, a finite differential output is generated across terminals 130-P/130-M, and the magnitude of the output is proportional to the mismatch in the ratio of resistances as noted above.

According to an aspect of the present disclosure, a calibration mechanism is provided (and implemented within amplifier 200) to minimize (ideally reduce to zero) the mismatch in the resistances of the feedback resistors and/or input resistors, as described in detail next.

3. Resistor Network

Figure 3:
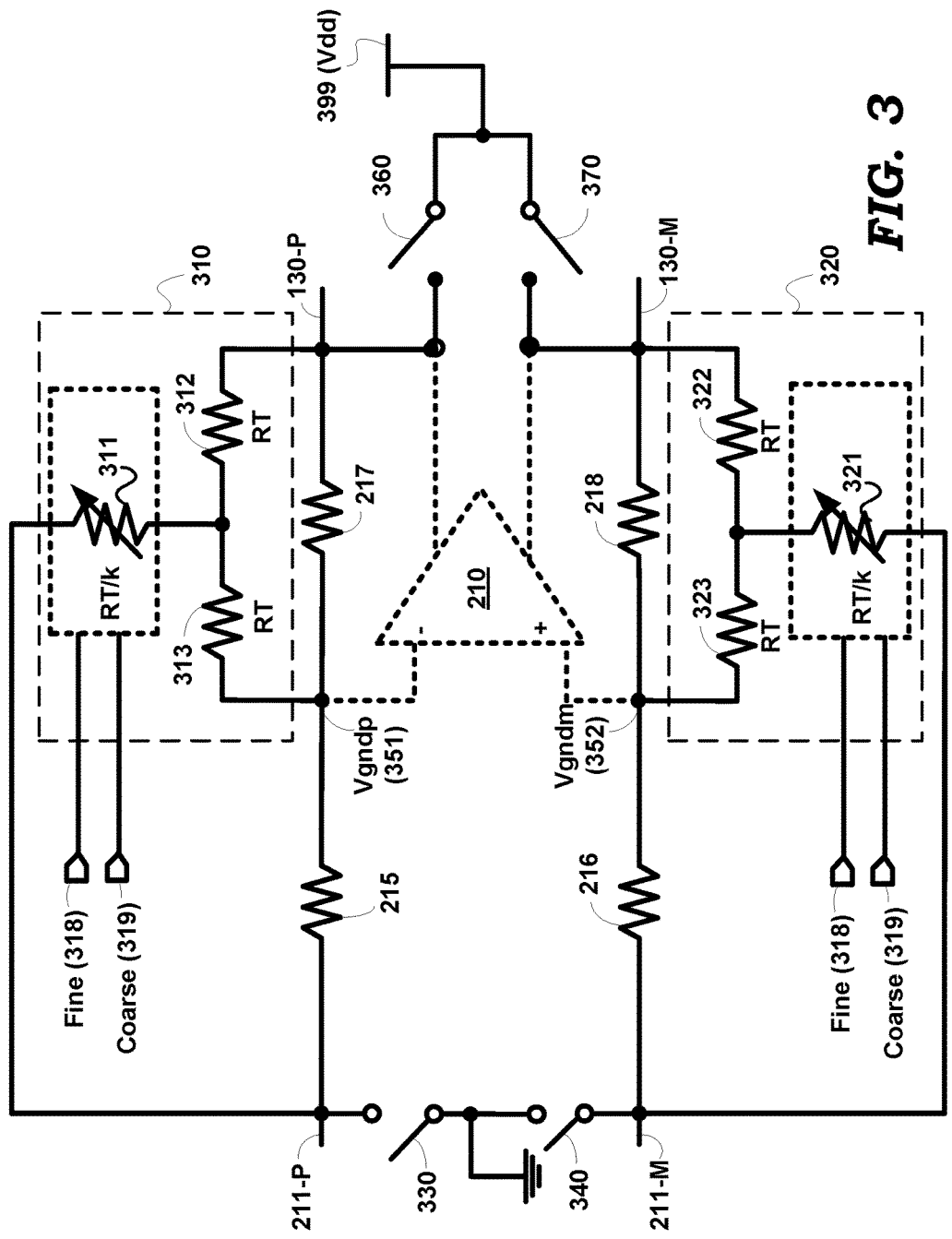
FIG. 3 is a block diagram used to illustrating the manner in which mismatch in resistance values of feedback resistors and/or input resistors in an amplifier is minimized, in an embodiment of the present disclosure.

FIG. 3 is a block diagram used to illustrate the manner in which mismatch in ratios of resistance values of respective feedback resistors and corresponding input resistors of an amplifier is minimized, in an embodiment of the present disclosure. In the description below, the term 'first feedback resistance' is the effective value of resistance between nodes 130-P and 351. The term 'second feedback resistance' is the effective value of resistance between nodes 130-M and 352. The term 'first input resistance' is the effective value of resistance between nodes 351 and 211-P. The term 'second input resistance' is the effective value of resistance between nodes 352 and 211-M.

FIG. 3 shows the details of amplifier 200 of FIG. 2A. Additionally, resistor networks 310 and 320, and switches 330, 340, 350 and 360 are also shown. Each of switches 330, 340, 350 and 360 may be operable to be closed or open by a control block, described below. According to an aspect of the present disclosure, resistor networks 310 (first resistor network) and 320 (second resistor network) are respectively connected across (i.e., in parallel with) feedback resistors 217 and 218. The combination of resistor 215, and network 310 is referred to herein as the P-side resistors, while the combination of resistor 216, and network 320 is referred to herein as the M-side resistors. Networks 310 and 320 are provided within power amplifier 130 (for example, within amplifier 200).

In an embodiment of the present disclosure, each of networks 310 and 320 is implemented as a T-network, as illustrated in FIG. 3. As is well-known in the relevant arts, a T-network of resistors contains two resistors in series, and a third resistor having one terminal connected to the junction of the two resistors. The resistor network has three nodes, and resembles a "T". Although noted as a T-network, other network configurations of resistors can also be used for networks 310 and 320. In general, networks 310 and 320 can be implemented in any form provided the networks can be controlled to provide different values of resistances when connected in different connection configurations. For example, when implemented as T-networks as shown in FIG. 3, the resistances of one arm (311 and 321) of the corresponding network can be varied, thereby allowing an effective resistance of the combination of the resistor network and the corresponding feedback resistor to be variable.

T-network 310 is shown containing resistors 312 and 313 and variable resistor 311. Although shown as a single variable resistor, physically, resistor 311 may be implemented in the form of multiple series-connected resistors as noted below. The values of resistors 312, 313 and 311 are respectively denoted as RT, RT and RT/k, wherein k is variable. By varying the value of k, different values of effective resistance (effective feedback resistance of P-side) of the combination of feedback resistor 217 and the corresponding resistance in parallel with resistor 217 can be obtained. The star network formed by resistors 311, 312 and 313 can be equivalently represent by a delta network containing three resistors, the first one in parallel with resistor 217 (and having a resistance value of (k+2)/RT), the second one connected between nodes 351 (Vgndp) and 211-P (and having a resistance value of [(k+2)/k]*RT) and the third one connected between nodes 211-P and 130-P (and having a resistance value also of [(k+2)/k]*RT). Varying resistor 311 effectively varies the first resistance present in parallel with feedback resistor 217), and therefore the effective resistance between nodes 130-P and 351 (Vgndp). Digital inputs on path 318 (Fine) and 319 (Coarse) control the value of resistance 311, as described below.

T-network 320 is shown containing resistors 322 and 323 and variable resistor 321. The values of resistors 322, 323 and 321 are also respectively denoted as RT, RT and RT/k, wherein k is variable. Digital inputs on path 318 (Fine) and 319 (Coarse) control the value of resistance 321. Just as noted above with respect to T-network 310, varying the value of resistor 321 effectively changes the resistance (effective feedback resistance of M-side) that is present in parallel with feedback resistor 218, and therefore the resistance between nodes 130-M and 352 (Vgndm). Thus, by adjusting/varying resistances 311 and 321, the mismatch between resistances of feedback resistors 217 and 218, as well as between resistances of input resistors 215 and 216 can be obtained.

Figure 4:
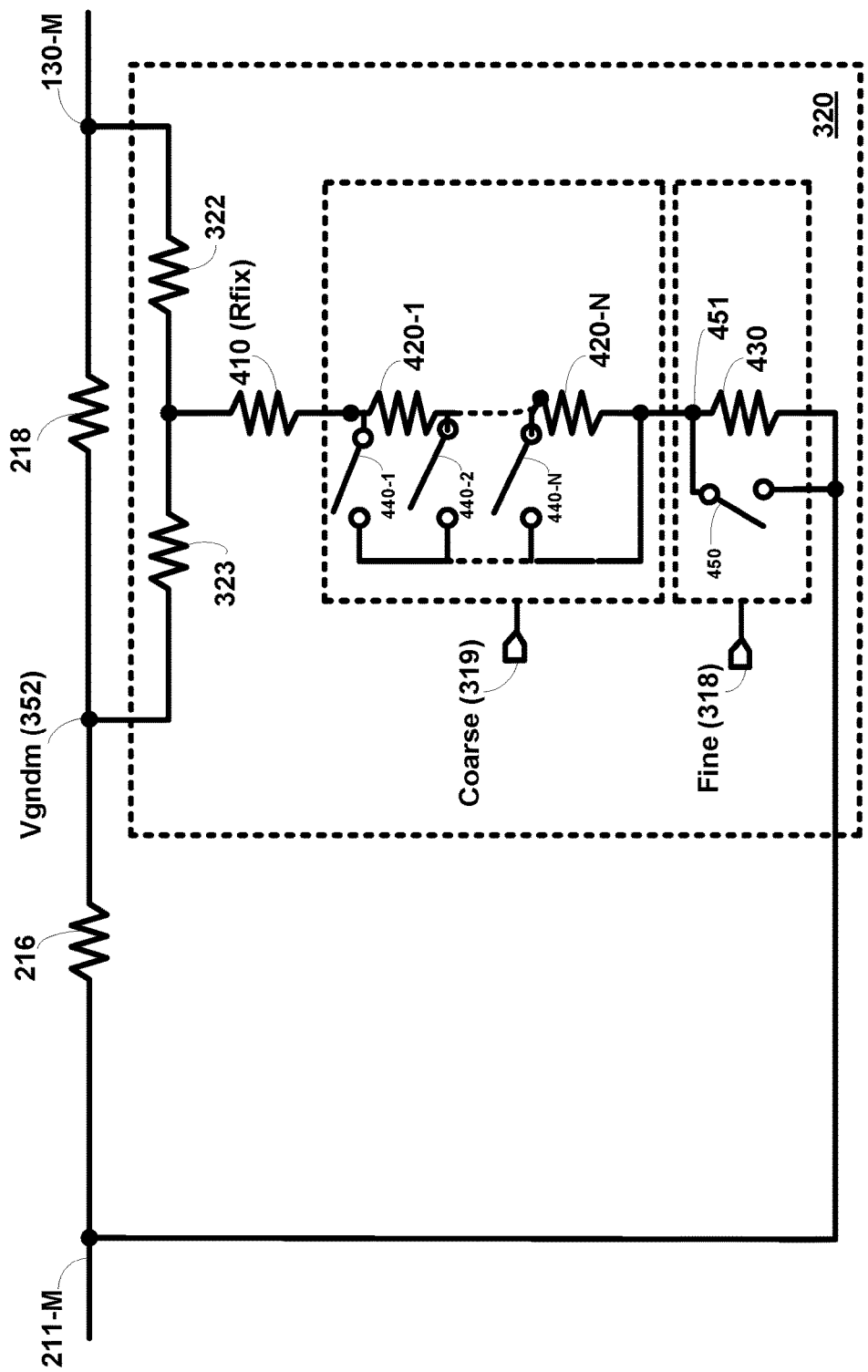
FIG. 4 is a circuit diagram illustrating the details of a T-network, in an embodiment of the present disclosure.

In an embodiment, each of resistors 311 and 321 is implemented as multiple series-connected resistors in combination with corresponding switches as illustrated in FIG. 4. In FIG. 4, one T-network (320) is shown. Also shown are feedback resistor 218 and input resistor 216. Resistors 323 and 322 are implemented as individual resistors, although series combination of resistors can also be used.

Variable resistor 321 of T-network 320 is shown implemented to contain resistor 410, resistors 420-1 through 420-N, resistor 430, and switches 440-1 through 440-N. Resistors 410, 420-1 through 420-N and 430 are connected in series. Switches 440-1 through 440-N are controlled to be open or closed by digital signals on path 319 (Coarse). Switch 430 is controlled to be open or closed by digital signal on path 318 (Fine). It may be observed from FIG. 4 that closing of switch 440-N effectively removes resistor 420-N from the series path formed by the resistors. Similarly, closing of switch 440-1 removes all of resistors 420-1 through 420-N from the series path. Closing other switches in 440-1 through 440-N removes the corresponding resistors from the series path. Alternatively, the switches 440-1 through 440-N can be implemented to be in parallel with a respective one of resistors 420-1 through 420-N. such that The signals on path 319 may be generated by a control block, described below.

According to an aspect of the present disclosure, the digital control signal on path 318 (Fine) is a single bit stream of ones and zeroes that open and close switch 450 at a high frequency. The average value of the ones and zeros constituting the bit stream determines the effective value of the resistance between nodes 451 and 211-M. The digital control signal on path 318 may also be generated by the control block that generates control signals on path 318. T-network 310 is implemented similar to T-network 320 shown in FIG. 4.

In an embodiment, each time power amplifier 130 is powered-ON, a calibration procedure is performed to minimize (ideally reduce to zero) the mismatch between the feedback resistors 217/218, as well as between the input resistors 215/216. Referring again to FIG. 3, prior to calibration, gain block 210 is either powered-OFF or disconnected from the connections to nodes 351, 352, 130-P and 130-M by using switches (not shown), as indicated in FIG. 3 by the dotted lines. Switches 330 and 340 are closed, thereby connecting nodes 211-P and 211-M to ground. Switches 360 and 370 are also closed thereby connecting each of nodes 130-P and 130-M to a power supply Vdd (399). Power supply Vdd may be generated internally in power amplifier 130.

Nodes 351 (Vgndp) and 352 (Vgndm) are connected to the control block (noted above) via switches (not shown), and the voltage across nodes 351 and 352 is measured, as further described below. Depending on the measured voltage, the control block increases or decreases resistances 311 and 321 to minimize the voltage, thereby minimizing the mismatch between the effective resistance across nodes 130-P/351 and 130-M/352, as well as mismatch between resistances 215 and 216. Ideally, the control block operates to make the voltage at Vgndp equal to that at Vgndm. In practice, the difference between the voltages at Vgndp and Vgndm is minimized to be within a acceptable tolerance range. Thus, the voltages at Vgndp and Vgndm are said to be equal if the difference between the voltages at node Vgndp and Vgndm is reduced to zero or to a value within an acceptable tolerance range (lot less than 1%, say of the order of less than 0.5%) of zero.

Once the calibration as noted above is complete, the last values of resistances 311 and 321 are retained. The respective switches controlled by the fine (318) signal continue to be opened and closed based on the digital bit-stream in control signal 318. Gain block 210 may then be powered-ON, or the connections between gain stage 210 and nodes 351/352 and 130-P/130-M restored, and amplifier 200 (and power amplifier 130) may receive corresponding input signals, and generate corresponding amplified signals across outputs 130-P/130-M with reduced distortion.

In an alternative embodiment of the present disclosure, rather than comparing the effective feedback resistances and/or the input resistances of the P-side resistors with those of the M-side resistors, the effective feedback resistance and input resistance of each side is separately compared with a reference network, and adjusted to be equal as described next.

4. Reference Network

Figure 5:
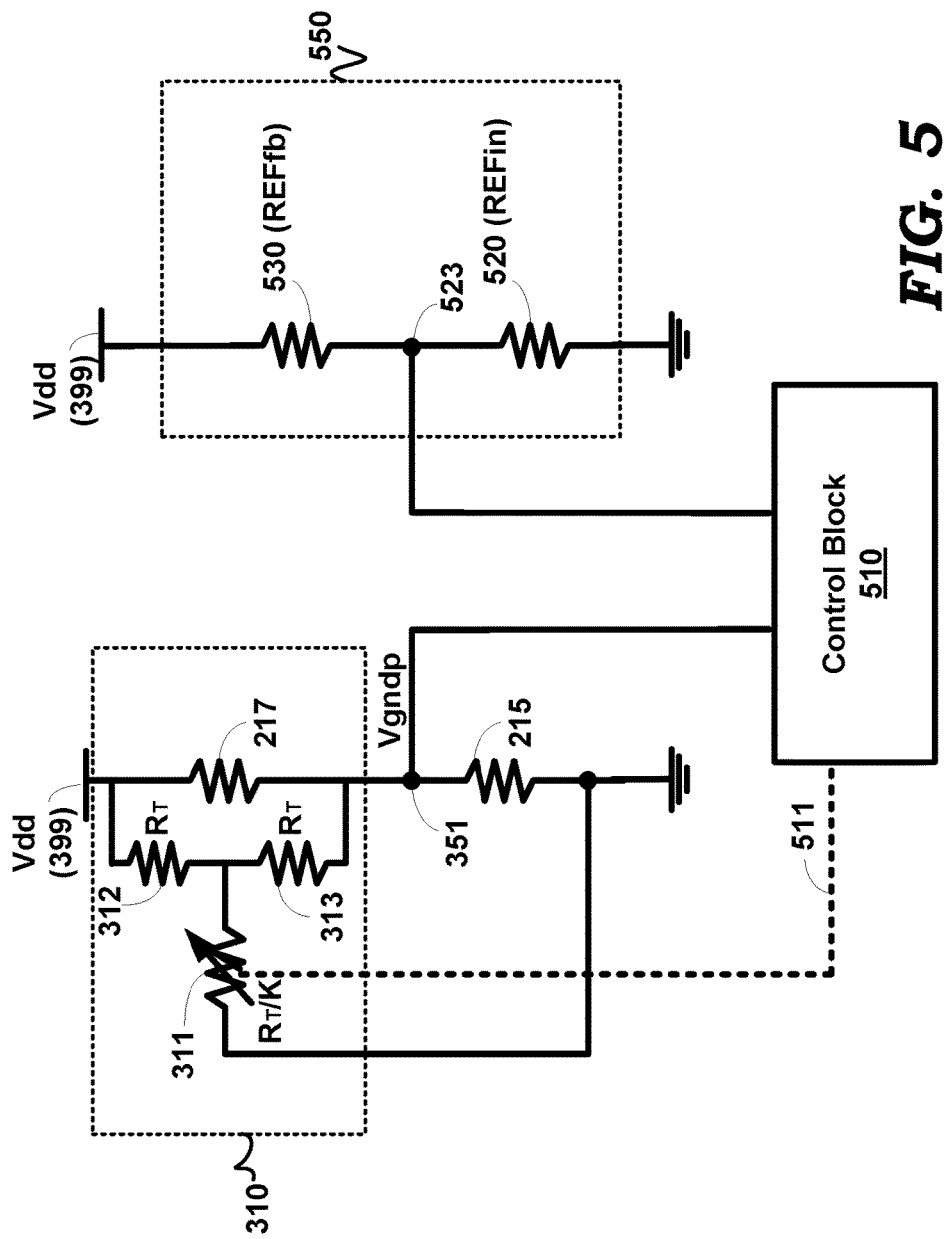
FIG. 5 is a block diagram illustrating the manner in which mismatch in resistance values of feedback resistors and/or input resistors in an amplifier is minimized, in an alternative embodiment of the present disclosure.

FIG. 5 is a diagram illustrating the manner in which mismatch in ratios of resistance values of respective feedback resistors and corresponding input resistors in an amplifier is minimized, in an alternative embodiment of the present disclosure. FIG. 5 is shown containing resistor 215, T-network 310, reference network 550, and control block 510. Reference network 550 is shown containing resistor 520 (REFin) and resistor 530 (REFfb), which may be referred as reference resistors. Node 523 may be referred as a reference junction. The combination of control block 510, switches 330, 340, 350 and 360 (of FIG. 3), T-networks 310 and 320 and the reference resistors may be viewed as a calibration unit. Although not shown in the Figures, calibration unit may also include a processing unit and memory. The processing unit is designed to cause calibration unit to operate as described herein to reduce mismatch in resistance ratios Reference network 550 is contained within amplifier 200. Resistor 520 and resistor 530 are chosen to respectively have resistance values equal to that of the input resistor (desired value of resistors 215 or 216) and feedback resistor (desired value of resistor 217 or 218). Reference network 550 is provided to enable matching of the ratio of resistances of resistors 217 and 215, and of the ratio of resistances of resistors 218 and 216 by comparing each of the ratios to the ratio of resistances of 520 and 530 of reference network 440. It is noted here that the absolute value of the ratio 217/215 or 218/216 is not critical for linearity.

Control block 510, which was also referred to above, receives the voltages at Vgndp and node 523, and operates to change the value of resistance 311 via path 511 (which is deemed to contain digital signals 318 and 319 noted above with respect to FIG. 3), until the voltages at Vgndp and node 523 are equal. The voltages are said to be equal if the difference between the voltages at node Vgndp and node 523 is reduced to zero or to a value within an acceptable tolerance range (lot less than 1%, say of the order of less than 0.5%) of zero.

The combination of input resistor 216 and T-network 320 is also used similarly in conjunction with the reference network to enable control block 510 to adjust resistance 321 until the difference in voltages between nodes Vgndm and node 523 is minimized to zero or to a value within an acceptable tolerance range of zero.

In an embodiment, power amplifier 200 contains two amplifiers, each similar to amplifier 200, and the techniques noted above are used to minimize any mismatches in the corresponding feedback resistors and input resistors of all of such amplifiers. Corresponding switches may be used to connect corresponding nodes of the desired one of T-networks 310 and 320 to the respective terminals (Vdd, ground, input to control block 510, etc.) in a known way.

In an embodiment of the present disclosure, each of resistors 311 (of T-network 310) and 321 (of T-network 320) is implemented to contain 31 resistors, and the digital code Coarse (318) is a 5-bit code (ranging from 0 through 31). The values of RT and k are chosen to ensure that sufficient correction range is available based on the expected mismatch between the corresponding feedback resistors and/or input resistors.

In an embodiment, each of resistors 215 and 216 is designed to be (ideally) 50 kilo ohms, each of resistors 217 and 218 is designed to be (ideally) 200 kilo ohms, the correction range is designed to correct a ratio mismatch of approximately ±0.5%, RT equals 1.5 mega ohms, and k is variable from approximately 11 to 31. Each of resistors 420-1 through 420-N (N being equal to 31) is implemented as a 1 kilo ohm resistor. Resistor 410 (Rfix) is implemented as a 42 kilo ohm resistor. Resistors 520 and 530 are each implemented to be within 0.1% error of the ideal resistance values of 50 kilo ohms and 200 kilo ohms respectively.

It is noted here that the use of a resistor network (such as T-networks 310 and 320) in parallel (rather than in series) with the feedback resistors enables correction of mismatch to within high levels of accuracy (±0.03% in an embodiment) while still being able to use reasonable resistance values (1 kilo ohm in the example of FIG. 4). Use of resistors in series with the feedback resistors (or input resistors) to enable correction of mismatches may require the use of very small-valued resistors (e.g., of the order of 5 ohms), which may not be practically feasible to implement. It is noted here that, although shown coupled in parallel with resistors 217 and 218 respectively, resistor networks 310 and 320 can instead be coupled in parallel with resistors 215 and 216 respectively with correspondingly appropriate values, and in manner similar to as described below to achieve matching of the ratio (217/215) with ratio (218/216).

It may thus be appreciated that the resistances present across various junctions/terminals may be varied to obtain various benefits contemplated according to features of the present disclosure. The specific example approach described above is summarized below with respect to FIG. 6.

Figure 6:
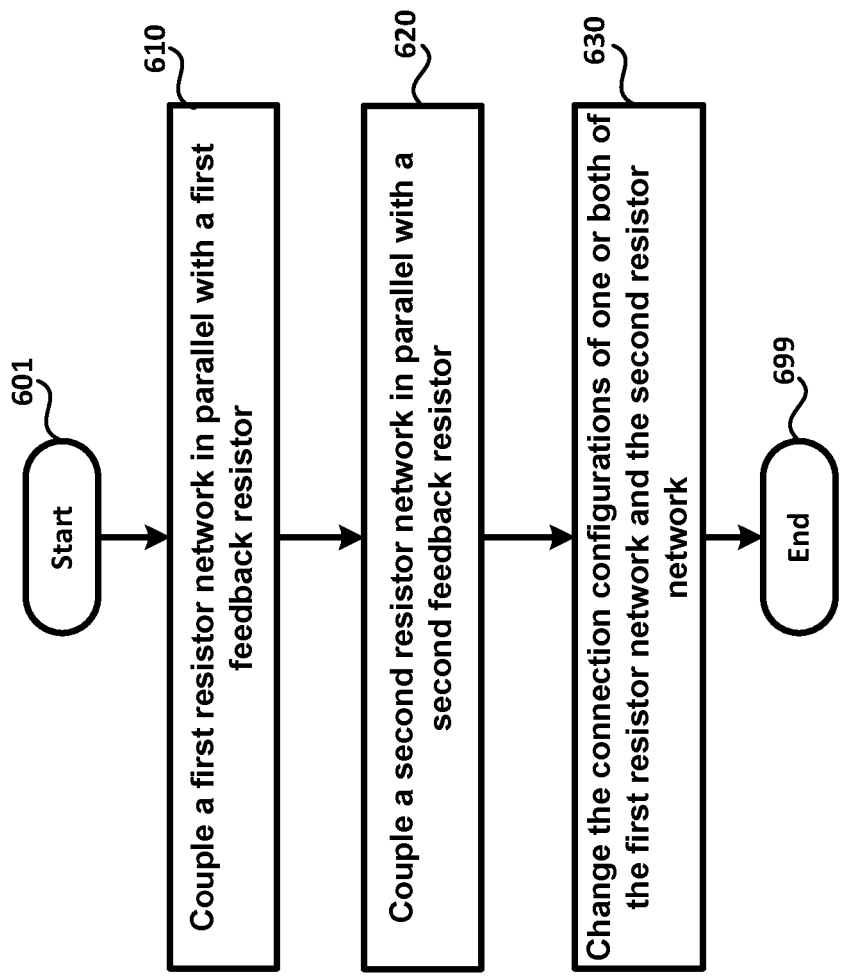
FIG. 6 is a flowchart illustrating the manner in which mismatch in resistance values of feedback resistors and/or input resistors is minimized in an embodiment of the present disclosure.

FIG. 6 is a flowchart illustrating the manner in which mismatch in resistance values of feedback resistors and/or input resistors is minimized in an embodiment of the present disclosure. Although the steps of the flowchart are shown to be in sequential order, some or of all of the steps may be concurrently executed. The flowchart starts in step 601, in which control immediately passes to step 610.

In step 610, a first resistor network is coupled in parallel with a first feedback resistor. The first resistor network contains multiple individual resistors, and is configurable to provide different effective resistances in different connection configurations. Control then passes to step 620.

In step 620, a second resistor network is coupled in parallel with a second feedback resistor. The second resistor network also contains multiple individual resistors, and is configurable to provide different effective resistances in different connection configurations. Control then passes to step 630.

In step 630, the connection configurations of one or both of the first resistor network and the second resistor network is changed until a first voltage at a first junction of the first feedback resistor and a corresponding first input resistor equals a second voltage at a second junction of the second feedback resistor and a corresponding second input resistor. Changing the connection configurations of the first and second resistor networks changes the effective resistance that is contributed by the first resistor network to the first feedback resistor, and also the effective resistance that is contributed by the second resistor network to the second feedback resistor. Control then passes to step 699, in which the flowchart ends.

The manner in which control block 510 is implemented to perform coarse and fine calibration of the corresponding resistor networks is described next with respect to an example embodiment.

5. Coarse and Fine Calibration

Figure 7:
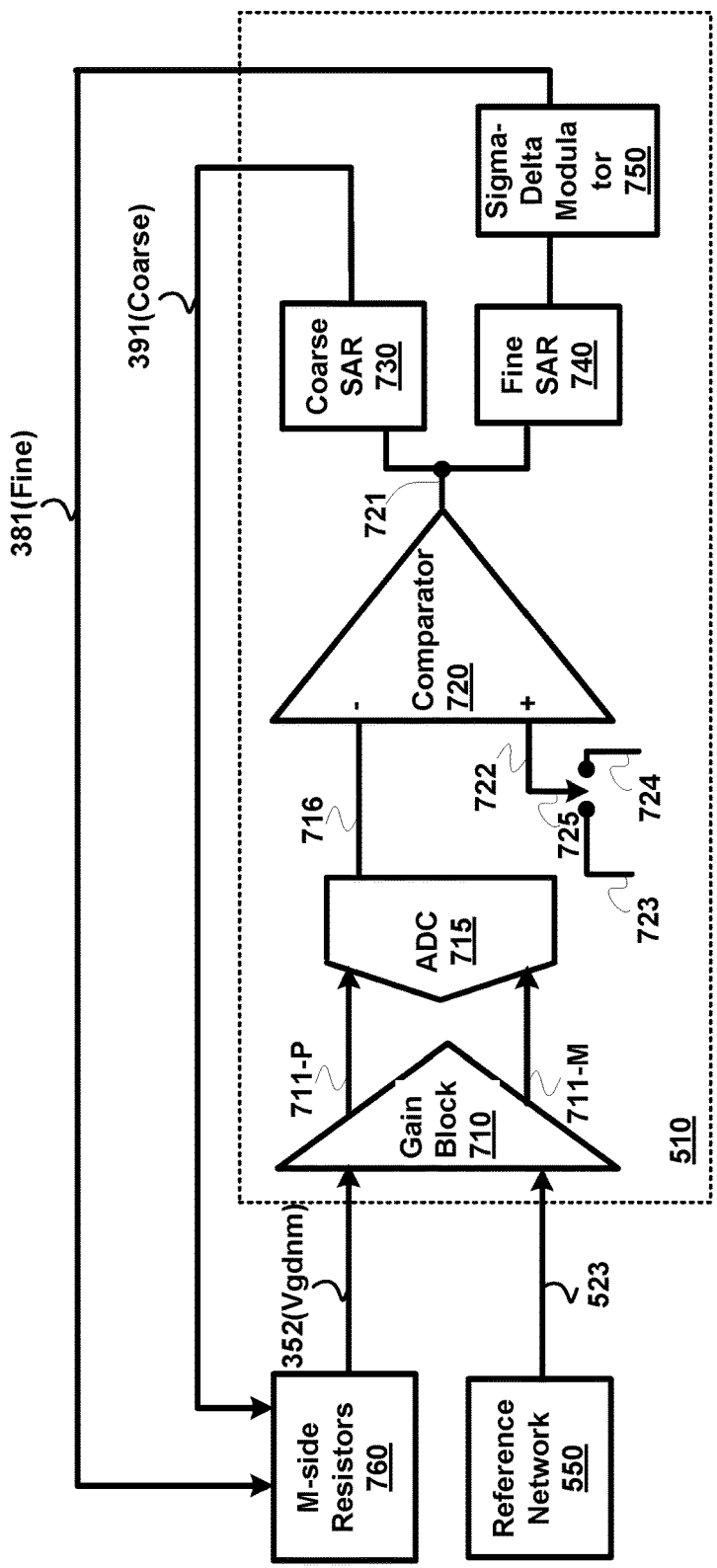
FIG. 7 is a block diagram illustrating the details of a control block in an amplifier, in an embodiment of the present disclosure.

FIG. 7 is a block diagram illustrating the details of control block 510, in an embodiment of the present disclosure. Also shown are M-side resistors 760 and reference network 550. M-side resistors 760 represent the combination of resistor 216 and resistor network 320 of FIG. 4. Control block 510 is shown containing gain block 710, analog-to-digital converter (ADC) 715, comparator 720, coarse successive approximation register (SAR) 730, fine SAR 740 and sigma-delta modulator (SDM) 750. M-side resistors 760 is replaced by P-side resistors (the combination of resistor 215 and resistor network 310) when calibration against reference network 550 is performed for the P-side resistors, and resistance 311 is adjusted.

Gain block 710 amplifies the voltage difference between nodes 352 (Vgndm) and 523, and provides the amplified difference to ADC 715 across nodes 711-P and 711-M. ADC 715 samples the voltage across nodes 711-P and 711-M at a corresponding sampling instances to generate digital codes representing the magnitude of the voltage across nodes 711-P/711-M at the sampled time instances. ADC 715 forwards the digital codes to comparator 720 on path 716. In an embodiment, ADC 715 is implemented to provide a nine-bit digital code as output.

Comparator 716 is a digital comparator, and receives the digital codes on path 716 on one input node (marked as '−'), and a fixed reference code on another input node 722 (marked as '+'). Comparator 720 generates on node 721 a binary value (e.g., single-bit value) representing the comparison result (i.e., greater than or less than operation) of comparison of the magnitudes of the digital codes on paths 716 and 722.

Prior to commencement of the calibration operations, any offset in gain block 710 is measured and the effect of the offset is cancelled. Accordingly, switch 725 is connected to path 724 on which a fixed code representing zero volts is received. Node 722 thus receives the fixed code representing zero volts. The inputs 352 and 523 of gain block 710 are shorted, and the resulting digital code on path 716 is stored (in a memory not shown, but contained within block 510). The resulting digital code represents any offset in gain block 710. The stored code representing the offset is thereafter provided as input to comparator 720 by connecting switch 725 to path 723 on which the stored code representing the offset is made available by the memory. Thereafter, switch 725 is connected to path 723, and block 510 commences the calibration operations.

During calibration operations, a binary value of signal 721 indicating that voltage at node 352 is greater than voltage at node 523, implies that resistance 321 should be reduced to minimize the voltage difference. A binary value of signal 721 indicating that voltage at node 352 is less than voltage at node 523, implies that resistance 311 should be increased to minimize the voltage difference.

According to an aspect of the present disclosure, control block 510 is designed to provide coarse correction (using a coarse SAR loop) as well as fine correction (using a fine SAR loop). Coarse SAR 730 is designed to generate an N-bit code (N being equal to 5 in an embodiment) on path 391 (Coarse) according to SAR technique, well-known in the relevant arts.

Thus, the initial value of the 5-bit code would contain a one in the most significant bit (MSB) position, with all other bits being zeros. The 5-bit digital value is converted by a binary-to-thermometric code translator contained (but not shown) in coarse SAR 730, and closes/opens the corresponding switches 440-1 through 440-N in block 760. Then, coarse SAR 730 again checks the binary value of signal 721. Depending on whether signal 721 indicates that voltage at node 352 is greater than voltage at node 523 or vice-versa, coarse SAR 730 sets the bit adjacent bit to the MSB to 1, with all other bit lesser-significant bits to zero, and either retains the MSB as one or resets the MSB to zero.

The resulting 5-bit code is translated to thermometric code and applied to open/close switches in block 760. Coarse SAR 730 operates to repeat the code generation and adjusting of the code in SAR fashion until the SAR procedure converges. The final configuration of switches 440-1 through 440-N obtained at the end of the operation of the coarse SAR is retained during normal operation of amplifier 200 i.e., when amplifier 200 is operational to generate power-amplified versions of the input signal 211-P/211-M. The combination of gain block 710, comparator 720, coarse SAR 730 and blocks 760 and 550 may be viewed as forming the coarse SAR loop.

Coarse SAR 730 reduces the mismatch between feedback resistors 217 and 218 and/or between input resistors 215 and 216, to approximately 0.03%, which corresponds to a total harmonic distortion (THD) of about −85 dB (decibels). Once the SAR procedure with coarse SAR 730 has converged, fine SAR 740 operates to further reduce the mismatch (to less than 0.03%).

Fine SAR 740 is also designed to operate according to the SAR technique. Fine SAR 740 generates an M-bit code, which is converted into a single-bit digital stream by SDM 750, which may be implemented using MASH (Multi-Stage Noise Shaping) techniques. The average value of the single-bit digital stream represents the M-bit code (M being equal to 9 in an embodiment). The digital stream is applied to control opening/closing of switch 450.

Fine SAR 740 then checks the digital value of signal 721, and the next M-bit code is generated according to the SAR technique, and the corresponding single-bit digital stream generated by SDM 750 is applied to control switch 450. Fine SAR 740 and SDM 750 continue the process of applying a digital stream to switch 450, and correcting the M-bit code according to SAR technique until the SAR process converges. Upon convergence, the last value of the M-bit code is retained and continues to be applied to SDM 750 even after end of the fine calibration procedure. Thus, the last value of the M-bit code retained is applied to SDM 750 even during the normal operation of amplifier stage 200 and power amplifier 130 (the normal operation referring to amplification of vsig 313 to generate a power amplified signal across 130-P/130-M), with SDM 750 continuing to generate the final (converged) one-bit sequence to control switch 450. Blocks in block 510 other than fine SAR 740 and SDM 750 may not be operational during normal operation of amplifier stage 200 and power amplifier 130. Thus, the opening and closing of switch 450 by the single-bit stream generated by SDM 750 after convergence continues even when amplifier 200 is operational to generate power-amplified versions of the input signal 211-P/211-M. The combination of gain block 710, comparator 720, fine SAR 740 and blocks 760 and 550 may be viewed as forming the fine SAR loop.

The use of a fine SAR plus MASH techniques allows fine matching of feedback resistors and/or input resistors without the requirement to substantially increase the number of resistors and switches in the T-networks.

Calibration, as described above, may be performed for the P-side resistors also. The P-side and M-side resistors may be calibrated against the same reference resistors to ensure matching. Further, calibration of M-side resistors and P-side resistors for each of the two amplifiers implemented similar to amplifier 200 may be performed each time power amplifier 130 is powered-ON. Once thus calibrated to minimize the mismatch between the feedback resistors and/or input resistors, amplifier 200 may be used in normal operation to amplify signals.

6. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1 through 7, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals. In the instant application, power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A method performed in a fully differential amplifier, wherein said fully differential amplifier comprises a gain block having a pair of differential input terminals and a pair of differential output terminals, a first feedback resistance present between a first input terminal of said pair of differential inputs terminals and a first output terminal of said pair of differential output terminals, a second feedback resistance present between a second input terminal of said pair of differential inputs terminals and a second output terminal of said pair of differential output terminals, a first input resistance present between said first input terminal and a first signal input node, a second input resistance present between said second input terminal and a second signal input node, wherein a common mode voltage is present on each of said first output terminal and said second output terminal, said method comprising:

equalizing a first ratio of said first feedback resistance to said first input resistance with that of a reference ratio of a pair of reference resistances; and equalizing a second ratio of said second feedback resistance to said second input resistance with that of said reference ratio, wherein maintaining said first ratio equal to said second ratio prevents variations in said common mode voltage from contributing an erroneous differential signal component across said pair of differential output terminals.

2. The method of claim 1, wherein said pair of reference resistances contain a pair of resistors connected in series at a reference junction, wherein said first input resistance is implemented as a first input resistor, wherein said first feedback resistance comprises a first resistor network in parallel with a first feedback resistor, wherein said first resistor network contains a first plurality of individual resistors providing different effective resistances in different connection configurations, wherein said equalizing of said first ratio comprises changing the connection configurations of said first resistor network until a first voltage at a first junction of said first feedback resistor and said first input resistor equals a second voltage at said reference junction.

3. The method of claim 2, further comprising:

measuring a third voltage at said reference junction and a first voltage at said first input terminal;

determining if said first voltage equals said third voltage, wherein said connection configuration of said first resistor network is changed if said determining determines that said first voltage is not equal to said third voltage.

4. The method of claim 3, wherein said second feedback resistance comprises a second resistor network in parallel with a second feedback resistor, wherein said second input resistance is implemented as a second input resistor, wherein said second resistor network contains a second plurality of individual resistors providing different effective resistances in different connection configurations, wherein said equalizing of said second ratio comprises:
measuring a fourth voltage at said reference junction and a second voltage at said second input terminal;
determining if said second voltage equals said fourth voltage,
wherein said connection configuration of said second resistor network is changed if said determining determines that said second voltage is not equal to said third voltage.

5. The method of claim 4, wherein said fully differential amplifier is comprised in a class-L power amplifier, wherein said first resistor network is a first T-network of resistors, and wherein said second resistor network is a second T-network of resistors.

6. The method of claim 4, wherein said changing is performed by a coarse successive approximation (SAR) loop to reduce a difference between said first voltage and said third voltage to a value equal to a first error value.

7. The method of claim 6, wherein said changing is further performed by a fine successive approximation (SAR) loop to reduce a difference between said first voltage and said third voltage to a value less than said first error value.

8. A differential amplifier to amplify an input signal received across a pair of signal input terminals, and to generate an amplified signal across a pair of output terminals, wherein a common-mode voltage is present on each of said pair of output terminals, said amplifier comprising:
 a first gain block having a pair of input nodes, the output of said first gain block being provided across said pair of output terminals;
 a first feedback resistance between a first input node of said pair of input nodes and a first output terminal of said pair of output terminals;
 a second feedback resistance between a second input node of said pair of input nodes and a second output terminal of said pair of output terminals;
 a first input resistance between said first input node and a first one of said pair of signal input terminals;
 a second input resistance between said input node and a second one of said pair of signal input terminals;
 a common-mode voltage generator block to generate a common-mode voltage, wherein said common mode voltage is applied to each terminal of said pair of output terminals, wherein during a normal operation of said differential amplifier, said common-mode voltage is designed to be a varying voltage; and
 a calibration unit comprising a pair of reference resistances, said calibration unit operable to:
  equalize a first ratio of said first feedback resistance to said first input resistance with that of a reference ratio of said pair of reference resistances; and
  equalize a second ratio of said second feedback resistance to said second input resistance with that of said reference ratio,
 wherein maintaining said first ratio equal to said second ratio prevents variations in said common mode voltage from contributing an erroneous differential signal component across said pair of differential output terminals.

9. The differential amplifier of claim 8, wherein said calibration unit further comprises a first resistor network and a second resistor network,
 wherein said pair of reference resistances contain a pair of resistors connected in series at a reference junction, wherein said first input resistance is implemented as a first input resistor,
 wherein said first feedback resistance comprises said first resistor network coupled in parallel with a first feedback resistor, wherein said first input resistance is implemented as a first input resistor, wherein said first resistor network contains a first plurality of individual resistors providing different effective resistances in different connection configurations,
 wherein said calibration unit equalizes said first ratio by:
  measuring a third voltage at said reference junction and a first voltage at said first input terminal;
  determining if said first voltage equals said third voltage, and
  changing said connection configuration of said first resistor network if said first voltage is not equal to said third voltage.

10. The differential amplifier of claim 9, wherein said second feedback resistance comprises said second resistor network coupled in parallel with a second feedback resistor, wherein said second input resistance is implemented as a second input resistor, wherein said second resistor network contains a second plurality of individual resistors providing different effective resistances in different connection configurations,
 wherein said calibration unit equalizes said second ratio by:
  measuring a fourth voltage at said reference junction and a second voltage at said second input terminal;
  determining if said second voltage equals said fourth voltage,
  changing said connection configuration of said second resistor network if said fourth voltage is not equal to said second voltage.

11. The differential amplifier of claim 10, wherein said first resistor network is a first T-network and said second resistor network is a second T-network,
 wherein a series combination of a first resistor of said first T-network and a second resistor of said first T-network is coupled between said first input node and said first output terminal, wherein a third resistor of said first T-network is coupled between a junction of said first resistor and said second resistor and said first signal input terminal,
 wherein a series combination of a fourth resistor of said second T-network and a fifth resistor of said second T-network is coupled between said second input node and said second output terminal, wherein a sixth resistor of said second T-network is coupled between a junction of said fourth resistor and said fifth resistor and said second signal input terminal,
 wherein said control block is operable to vary a resistance of each of said third resistor and said sixth resistor.

12. The differential amplifier of claim 11, wherein each of said third resistor and said sixth resistor comprises:
 a fixed resistor;
 a series connection of a first plurality of resistors coupled in series with said fixed resistor, wherein said series connection comprises a corresponding plurality of junctions between corresponding pairs of resistors of said third plurality of resistors;
 a first set of switches, wherein each switch in said first set of switches is operable to create an electrical short between a corresponding junction in said plurality of junctions, and a terminal of a last resistor of said plurality of resistors;
 a seventh resistor coupled between said terminal of said last resistor and the corresponding one of said pair of input terminals; and
 a first switch coupled in parallel with said seventh resistor.

13. The differential amplifier of claim 12, wherein said calibration block further comprises:
 a second switch operable to be closed to couple said first signal input terminal to a first reference potential;
 a third switch operable to be closed to couple said second signal input terminal to said first reference potential;
 a fourth switch operable to be closed to couple said first output terminal to a second reference potential; and
 a fifth switch operable to be closed to couple said second output terminal to said second reference potential.

14. The differential amplifier of claim 13, wherein said pair of reference resistances comprises an eighth resistor and a ninth resistor connectable in series between said first constant reference potential and said second constant reference potential, said calibration unit further comprising a control block, said control block comprising;
 a second gain block having a second pair of input nodes and a second pair of output nodes, wherein a junction of said first input resistor and said first feedback resistor is selectively connectable to said first input node, wherein a junction of said second input resistor and said second feedback resistor is selectively connectable to said second input node, wherein a third junction of said eighth resistor and said ninth resistor is selectively connectable to a second node of said second pair of input nodes;

an analog to digital converter (ADC) coupled to receive signals on each of said second pair of output nodes, said ADC to generate digital codes representing a magnitude of a voltage across said second pair of output nodes at corresponding sampling instances;

a comparator block coupled to receive said digital codes, said comparator block to generate a comparison output signal indicating whether a received digital code is greater than or less than a reference digital code; and a coarse successive approximation register (SAR) block coupled to receive said comparison output signal, said coarse SAR block to generate a first multi-bit digital value, wherein said multi-bit digital value controls the opening and closing of switches in said first set of switches.

15. The differential amplifier of claim 14, wherein said control block further comprises: a fine successive approximation register (SAR) block coupled to receive said comparison output signal, said fine SAR block to generate a second multi-bit digital value; and a sigma-delta modulator coupled to receive said second multi-bit digital value, and to generate a single-bit stream having an average value equal to a value of said second multi-bit digital value, wherein said single bit stream controls the opening and closing of said first switch.

16. The differential amplifier of claim 15, wherein during a first interval of a calibration phase, said calibration unit is operable to:

switch-off said first gain block;

connect said first junction of said first input resistor and said first feedback resistor to a first node of said second pair of input nodes;

connect said third junction of said eighth resistor and said ninth resistor to a second node of said second pair of input nodes;

close each of said second switch and said fourth switch; and cause said coarse SAR block to operate according to a SAR technique to iteratively generate a first plurality of multi-bit values as said first multi-bit value in response to corresponding values of said comparison output signal to reduce a voltage difference between voltages at said first junction and said third junction to a value equal to a first error value.

17. The differential amplifier of claim 16, wherein said configuration unit is operable to cause a combination of said fine SAR block and said sigma-delta modulator to operate according to said SAR technique to iteratively to generate a plurality of bit streams in response to corresponding values of said comparison output signal to further reduce said voltage difference between voltages at said first junction and said third junction to a value less than said first error value.

18. The differential amplifier of claim 17, wherein during a second interval of said calibration phase, said calibration unit is operable to:

switch-off said first gain block;

disconnect said first junction of said first input resistor and said first feedback resistor from said first node of said second pair of input nodes, connect said second junction of said second input resistor and said second feedback resistor to said first node of said second pair of input nodes;

connect said third junction of said eighth resistor and said ninth resistor to said second node of said second pair of input nodes;

close each of said second switch and said fourth switch; and cause said coarse SAR block to operate according to said SAR technique to iteratively to generate a second plurality of multi-bit values as said first multi-bit value in response to corresponding values of said comparison output signal to reduce a voltage difference between voltages at said second junction and said third junction to a value equal to said first error value.

19. The differential amplifier of claim 18, wherein said calibration unit is further operable to cause the combination of said fine SAR block and said sigma-delta modulator to operate according to said SAR technique to iteratively to generate a plurality of bit streams in response to corresponding values of said comparison output signal to further reduce said voltage difference between voltages at said second junction and said third junction to a value less than said first error value.

20. The differential amplifier of claim 11, wherein said calibration unit is further operable to cancel the effect of an offset voltage present at the inputs of said second gain block, wherein during said normal operation, said differential amplifier is powered by a power supply that has an instantaneous value that is greater than the instantaneous absolute value of said amplified signal by a headroom value, wherein an instantaneous magnitude said common-mode voltage is half of said instantaneous value of said power supply, wherein said differential amplifier is a class-L power amplifier.

* * * * *